(12) United States Patent
Thomsen

(10) Patent No.: US 6,870,377 B2
(45) Date of Patent: Mar. 22, 2005

(54) METHOD FOR DETECTING PIEZOELECTRIC ELEMENT FAILURES IN HEAD SUSPENSIONS

(75) Inventor: Jeffrey E. Thomsen, Cosmos, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 10/648,083

(22) Filed: Aug. 26, 2003

(65) Prior Publication Data

US 2004/0036479 A1 Feb. 26, 2004

Related U.S. Application Data

(62) Division of application No. 09/941,477, filed on Aug. 29, 2001, now Pat. No. 6,639,411.
(60) Provisional application No. 60/230,029, filed on Sep. 5, 2000.

(51) Int. Cl.[7] .............................. G01R 29/22; G11B 5/56
(52) U.S. Cl. .................... 324/727; 537/360; 537/294.1; 537/294.7

(58) Field of Search .................................. 324/727, 537, 324/158.1, 76.11; 360/294.1, 294.2, 294.3, 294.4, 294.7

(56) References Cited

U.S. PATENT DOCUMENTS 5,557,183 A * 9/1996 Bates et al. ................. 318/434

* cited by examiner

Primary Examiner—Vincent Q. Nguyen
(74) Attorney, Agent, or Firm—Faegre & Benson LLP

(57) ABSTRACT

Method and apparatus for detecting failure in a piezoelectric element on a head suspension for a disk drive by clamping one end of the suspension, mechanically displacing and rapidly releasing the other end of the suspension, monitoring the electrical output of a piezoelectric element on the suspension and comparing the output with a predetermined output, using a clamp, motion actuator, and signal processor. The comparison may be with a predetermined voltage, and the output may be a natural frequency having a fundamental frequency corresponding to individual failure modes including adhesive fracture, piezoelectric element fracture, poling failure or a broken electrical connection.

4 Claims, 18 Drawing Sheets

METHOD FOR DETECTING PIEZOELECTRIC ELEMENT FAILURES IN HEAD SUSPENSIONS

CROSS REFERENCE TO RELATED APPLICATION

This application is a division of application Ser. No. 09/941,477 filed Aug. 29, 2001, now U.S. Pat. No. 6,639,411, which claims the benefit of U.S. Provisional Application No. 60/230,029, filed Sep. 5, 2000. The entire contents of application Ser. Nos. 09/941,477 and 60/230,029 are hereby incorporated by reference.

BACKGROUND OF THE INVENTION

Microactuated suspensions are generally known and disclosed, for example, in the Krinke et al. U.S. Pat. No. 6,046,888. FIG. 1 is an illustration of one such microactuated suspension 30. The embodiment shown in FIG. 1 has an actuator or motor 32 formed by a pair of piezoelectric (PZT) elements 34, 36 for rotating or otherwise driving a load beam 38 with respect to a baseplate 40 in response to electric drive signals. Piezoelectric materials are also widely used as transducers of mechanical motion into electrical energy.

The piezoelectric elements are typically mounted to the suspension by adhesive. Adhesive fractures sometimes develop during the manufacturing process. As a result of these fractures, the piezoelectric elements are not properly mounted to the suspension, and will not function properly. Fractures are also sometimes present in the piezoelectric elements themselves, and can also prevent the microactuator from functioning properly. Still other microactuator failures occur when the piezoelectric elements are depoled, when the elements are oriented or electrically interconnected with the same polarity, and when the bonds between the drive signal lead wires and the element terminals are broken.

Known testing approaches for identifying motor failures include resistance and stroke tests. There remains, however, a continuing need for improved motor failure test methods and associated systems. Methods and systems which are capable of being efficiently performed and which can accurately identify a wide range of failures would be particularly desirable.

DETAILED DESCRIPTION OF THE PREFERRED EMBODIMENTS

The present invention is based upon the recognition that a wide range of microactuator failure modes can be efficiently detected by causing relative movement between the suspension portions being driven with respect to one another by the motor 32, and monitoring and evaluating the electrical signals produced by the motor. The characteristics of the electrical signals (e.g., shapes and levels) produced by a motor having a failure mode are sufficiently different than those of a properly functioning motor that the operational state can be accurately assessed.

Figure 1:
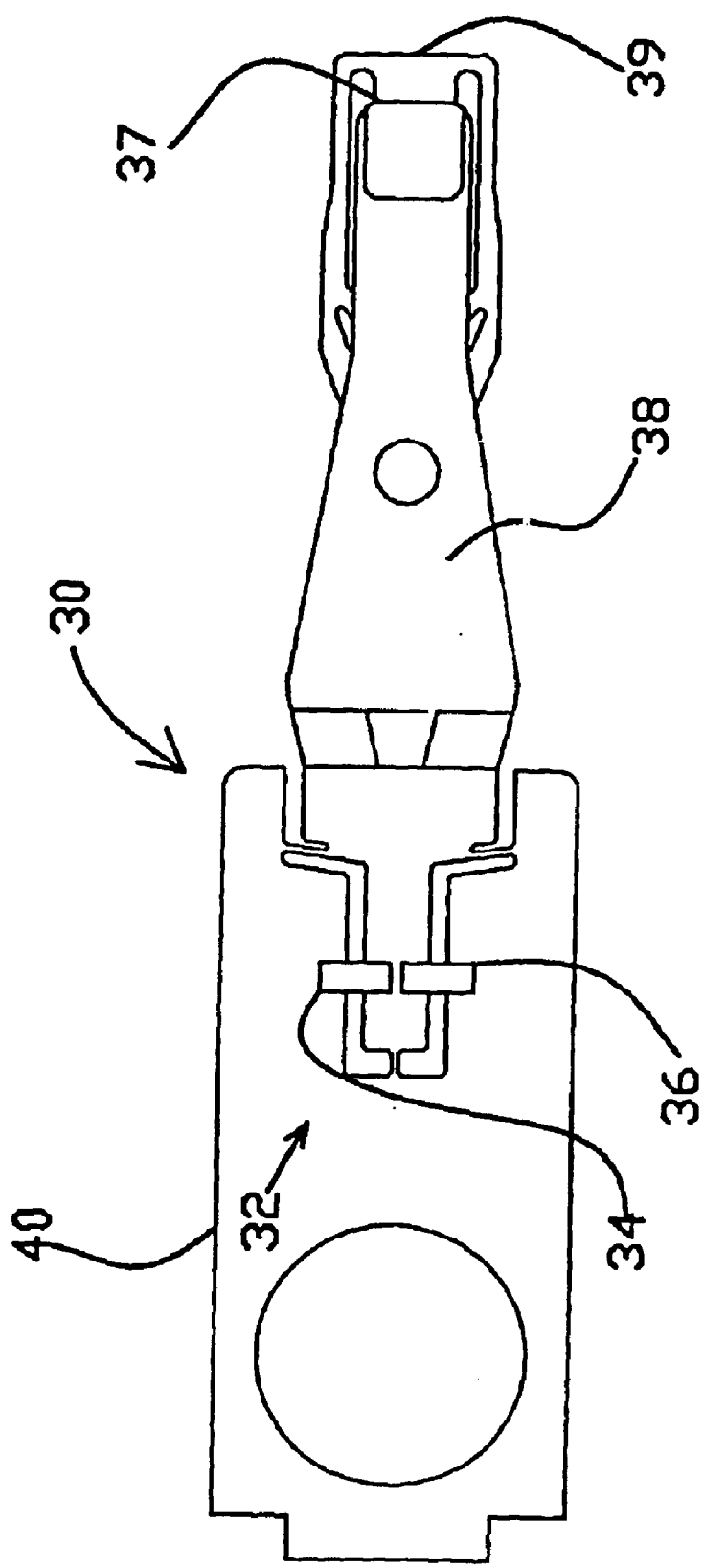
FIG. 1 is a simplified plan view of a head suspension having microactuator motors to which the present invention is directed.
Figure 2:
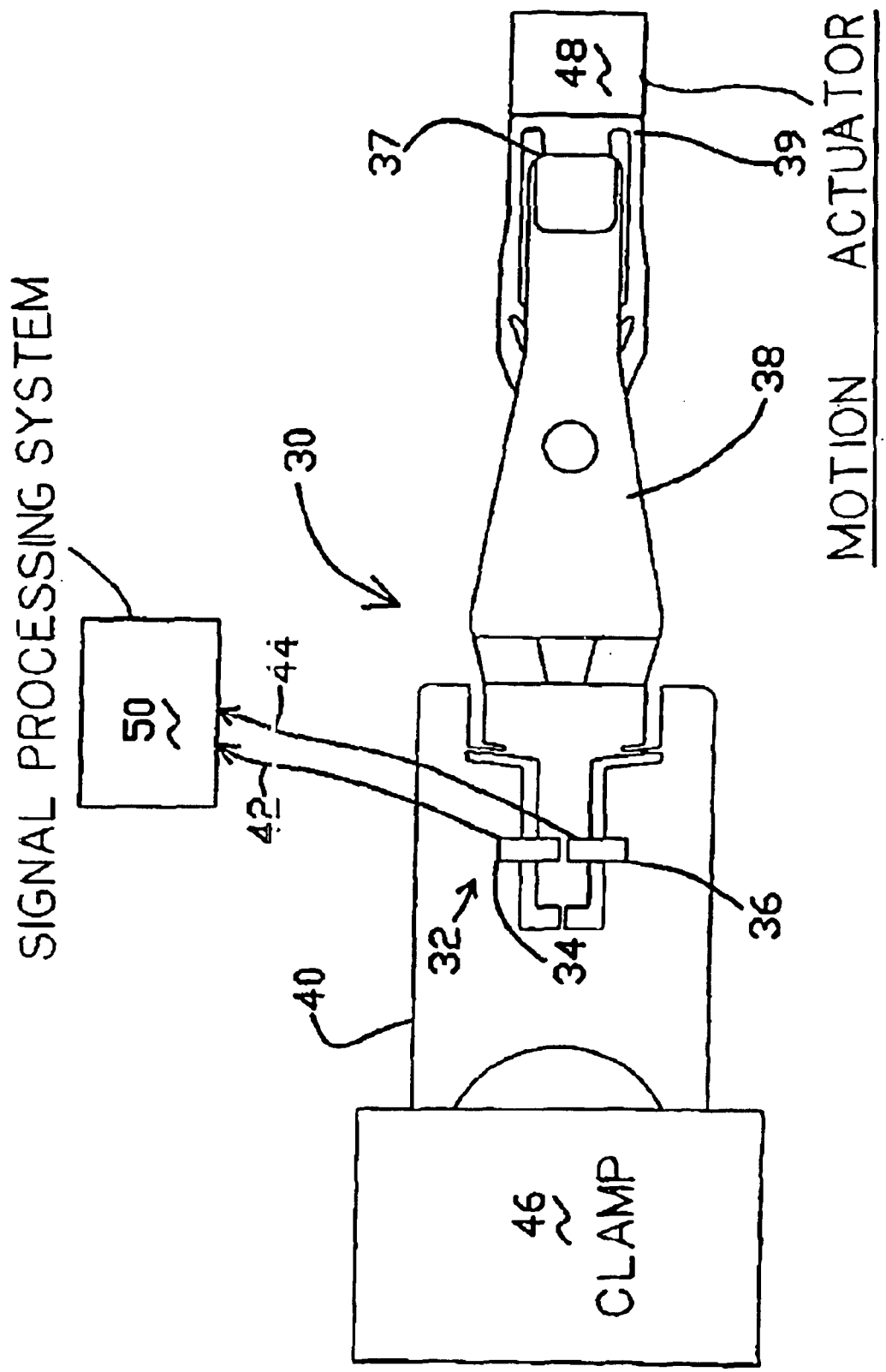
FIG. 2 is a schematic illustration of a microactuated suspension, together with a motor failure detection system according to the present invention.

The suspension design shown in FIGS. 1 and 2 includes two PZT elements 34, 36 that act as the motor 32 and provide fine adjustment of a read/write head 37. It is to be understood that the motor region 32 is the area on the suspension where the PZT elements 34, 36 are bonded. Damage to the motor region causes changes in the suspension's structural characteristics. An electrical charge is created by applying stress to the PZT elements 34, 36. The method of the present invention, referred to as the "ringout" method, applies stress to the motor region 32 containing the PZT elements 34, 36 and monitors the resultant voltage across nodes 42, 44. If the motor region 32 has a defect, the output voltage changes depending on the failure mode. In the design shown in FIGS. 1 and 2, the PZT elements 34, 36 carry a small percentage of the suspension gram load.

Ringout is a test method that may be used to detect motor structure damage such as adhesive delamination, broken wire bonds, depoled motors and some types of PZT fractures. One such type of fracture is a "hairline crack" i.e., a crack that permeates the top gold layer of a PZT element and can be enlarged by subjecting the top gold layer to a tensile stress. In contrast, as used herein, it is to be understood that a "microcrack" is a crack that does not permeate the top gold layer of the PZT element and cannot be observed by eye or microscope at any magnification even if the PZT element is stressed.

FIG. 2 is a schematic illustration of a microactuated suspension and a "ringout" motor failure detection system in accordance with the present invention. As shown, the motor failure detection system generally includes a clamp 46, a motion actuator 48 and a signal processing system 50. The suspension baseplate is clamped to a datum or fixed location by the clamp 46. The motion actuator 48 engages a headlift (not shown) or other component of the load beam 38 or flexure 39 and raises or lowers (e.g., moves) the load beam 38 with respect to the baseplate 40 (within its range of elastic deformation). The motion actuator 48 then releases the load beam 38 or flexure 39, thereby allowing the load beam to vibrate in a periodic manner at its natural frequency. The clamp 46 and motion actuator 48 of this embodiment of the invention thereby cooperate to cause relative movement between the suspension portions that are being driven with respect to one another by the piezoelectric elements 34, 36 of the motor 32.

Figure 3A:
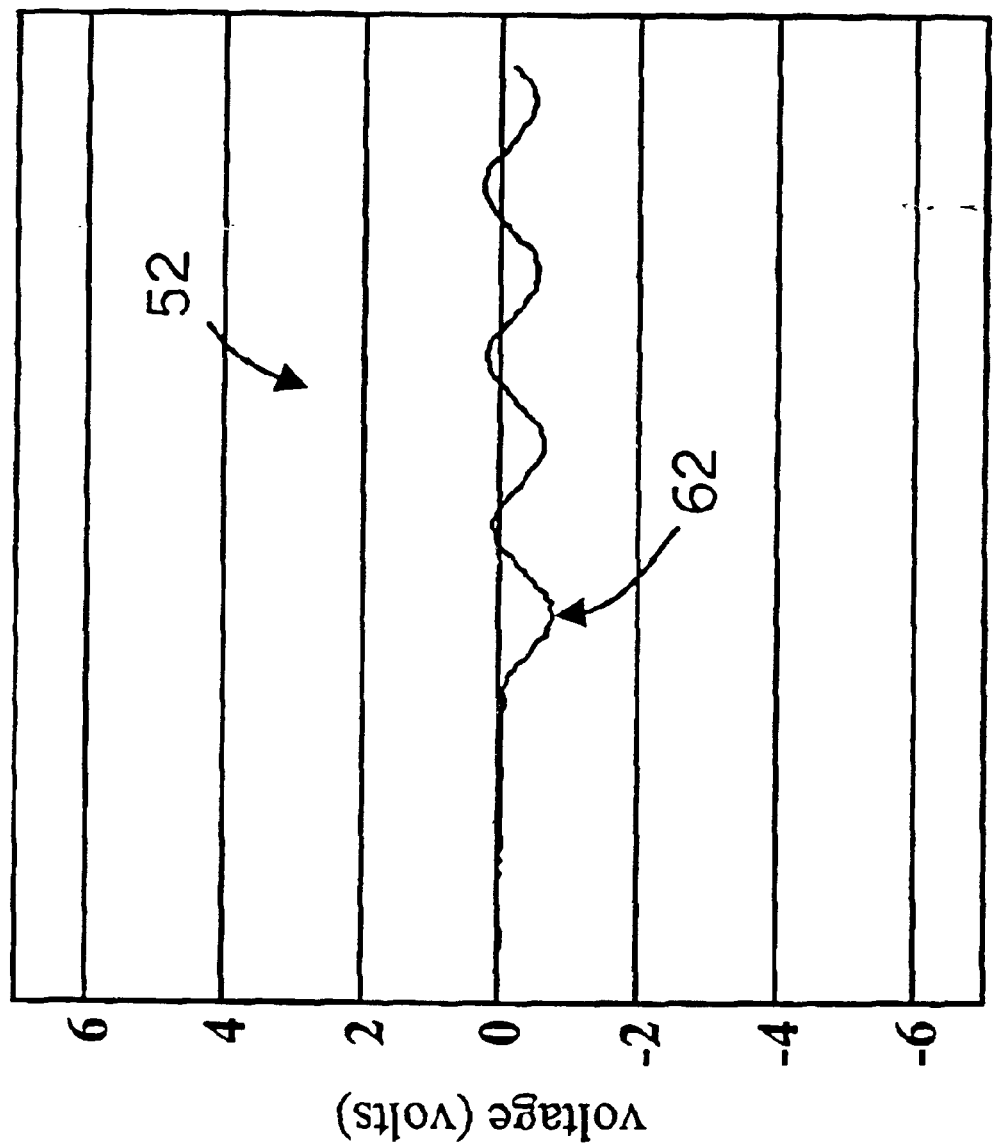
FIG. 3a is an output waveform of a good part.
Figure 3B:
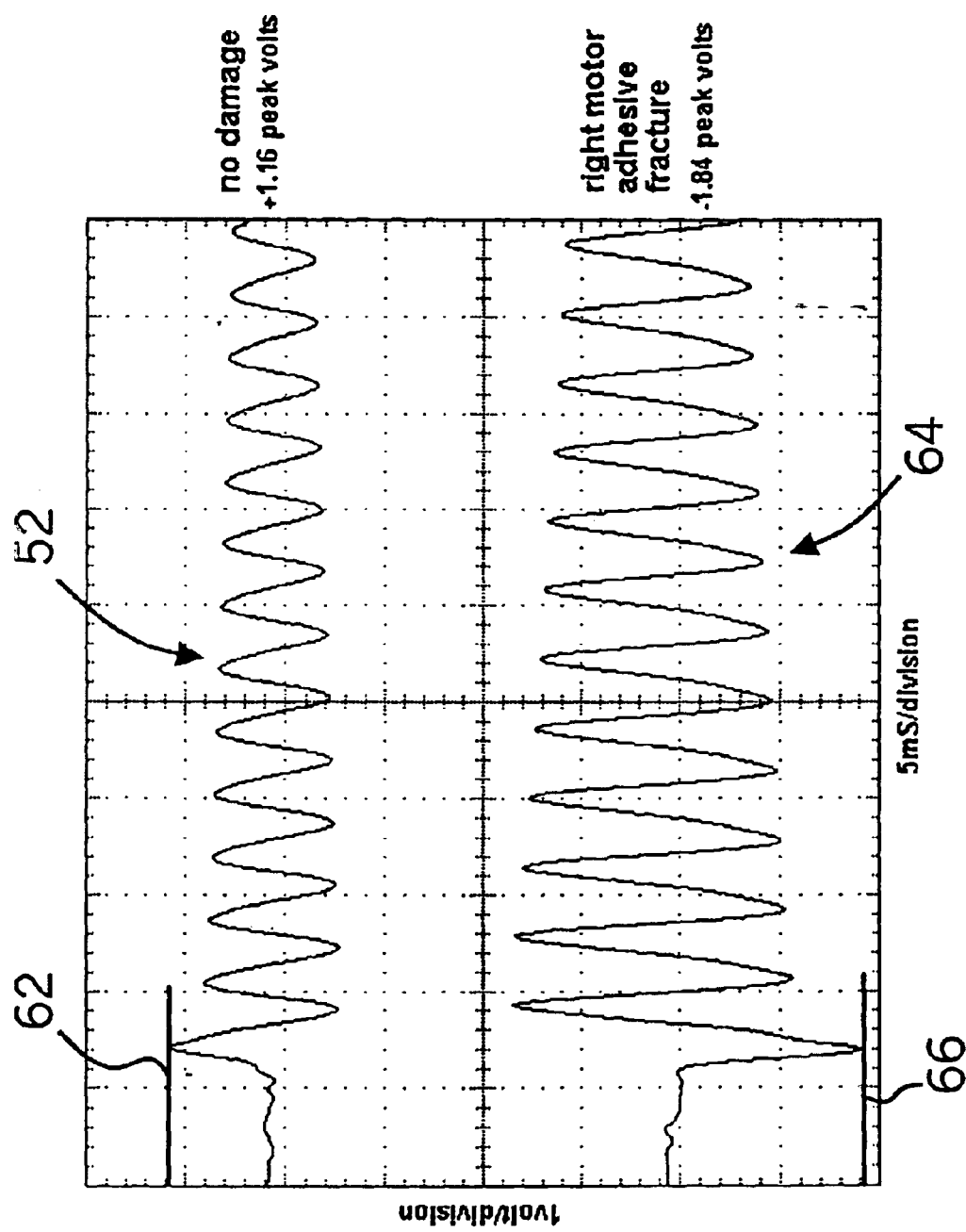
FIG. 3b is a graph of electrical signals produced by a properly functioning and mounted microactuator motor and a motor having an adhesive fracture.
Figure 3C:
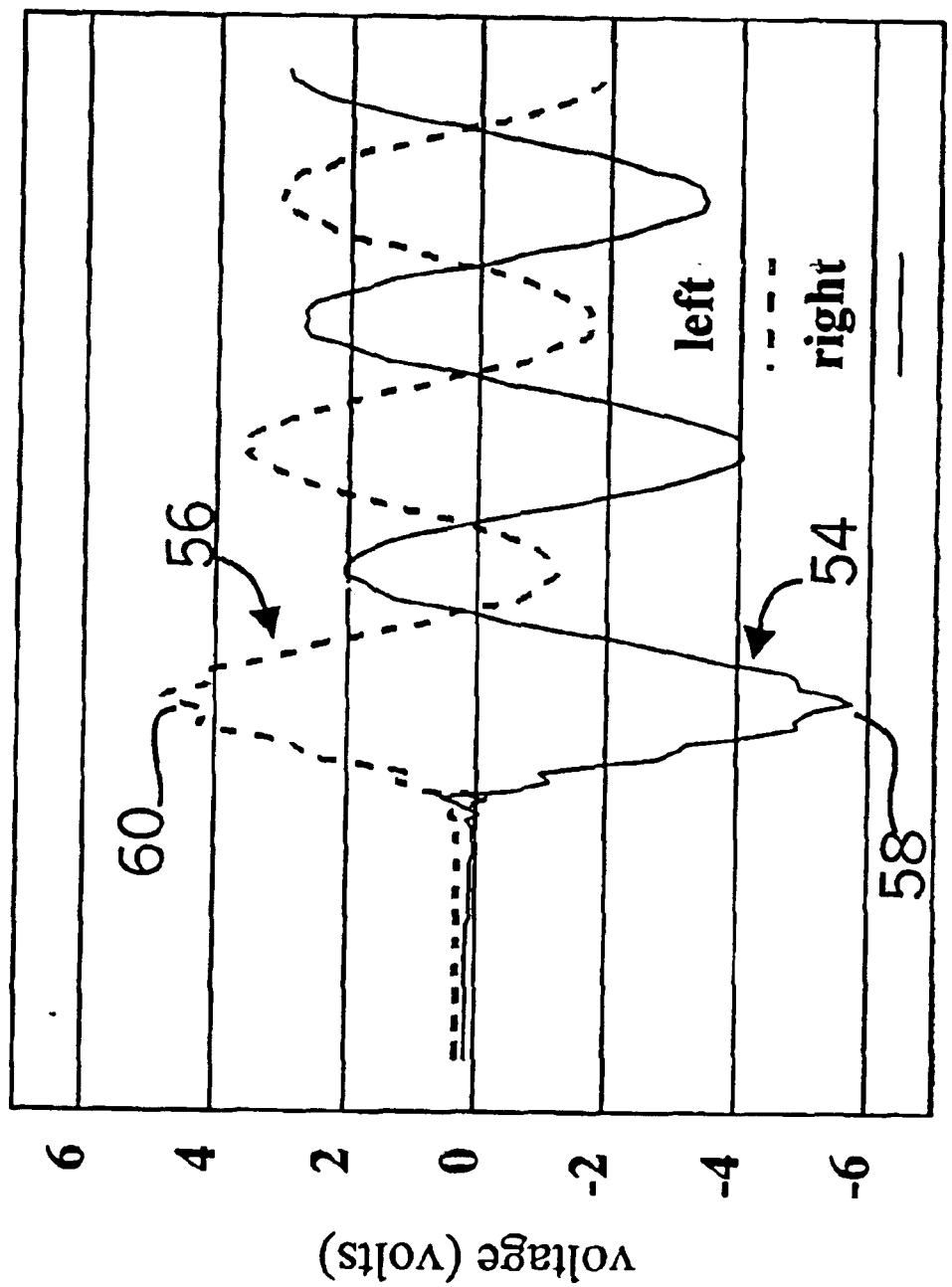
FIG. 3c is an output waveform of a part with the wire disconnected between the motors.

Referring to FIGS. 3a and 3b, as well as to FIG. 2, the electrical signal(s) produced by the motor in response to the movement on lines 42, 44 are monitored and evaluated by the signal processing system 50 to provide information representative of motor failure modes. Another embodiment of the invention (not shown) includes a motion actuator which engages a headlift on the suspension, and raises the suspension to its fly height before releasing the suspension and allowing the suspension to vibrate. The ringout method of the present invention takes advantage of this condition by applying stress to the PZT elements 34, 36 by lifting the part to flyheight while holding the base plate 40 stationary using a clamp 46. The part is then released, and the suspension 30 is allowed to freely resonate about its bending mode. The suspension design shown has the two PZT elements or motors 34, 36 connected in parallel. The voltage 52 measured at the trace is the sum of the voltages from the individual motors. Since the motors are poled in opposite directions, bending stresses will produce opposite charges on each motor. This electromechanical relationship is illustrated in FIG. 3c by disconnecting the wire between the two motors and displaying the output waveforms 54, 56 from each simultaneously as the part is tested. In this example, the peak voltage 58 from the right motor is approximately −5.7 v, compared to +4.9 v for the left motor peak voltage 60, as shown in FIG. 3c. The differing peak voltages are due to the fact that more stress is applied to the right motor because of the asymmetrical characteristics of the design, which is caused by the flexure being attached to one side of the suspension as opposed to being attached to the center of the part. When the load beam 38 is lifted to flyheight, stress is applied to both motors. A motor region failure mode, such as a cracked PZT motor or adhesive delamination, will change the applied stress in relation to the size and location of the fracture. The change in stress causes a proportional change in peak output voltage, which indicates the part is defective.

Returning to FIGS. 3a and 3b, the voltage waveform 52 of the PZT elements during a ringout test of a good part may be seen at two magnification levels. The first peak voltage 62 is used to determine if a defect exists; however, the entire waveform 52 provides additional information about the failure mode and may be used for that purpose. Note that the fundamental frequency for a good suspension (of the type shown) at free state is approximately 315 Hz in FIG. 3a and the first peak voltage measures −0.8 v (+/−0.2 v). A digitizing oscilloscope is connected to the PZT elements 34, 36 via the suspension trace and a 10× oscilloscope probe. A rigid shim holds the part at flyheight. The shim is removed from the part and the suspension 30 is allowed to resonate in bending. If possible, the headlift feature on the part is used to elevate the part to flyheight. However, if no headlift exists extreme care is taken to both elevate the part on the flexure 39 and to release the part by removing the shim from the flexure 39.

FIG. 3b is an inverted and expanded scale graph of the electrical signals produced by a properly functioning and mounted microactuator motor ("no damage") at waveform 52. FIG. 3b also shows a waveform 64 for a motor having an adhesive fracture on one of its piezoelectric elements ("right motor adhesive fracture"). As shown, the peak level 62 of the signal produced by the properly functioning motor is relatively low compared to the peak level 66 of the motor having the failure mode.

Figure 4:
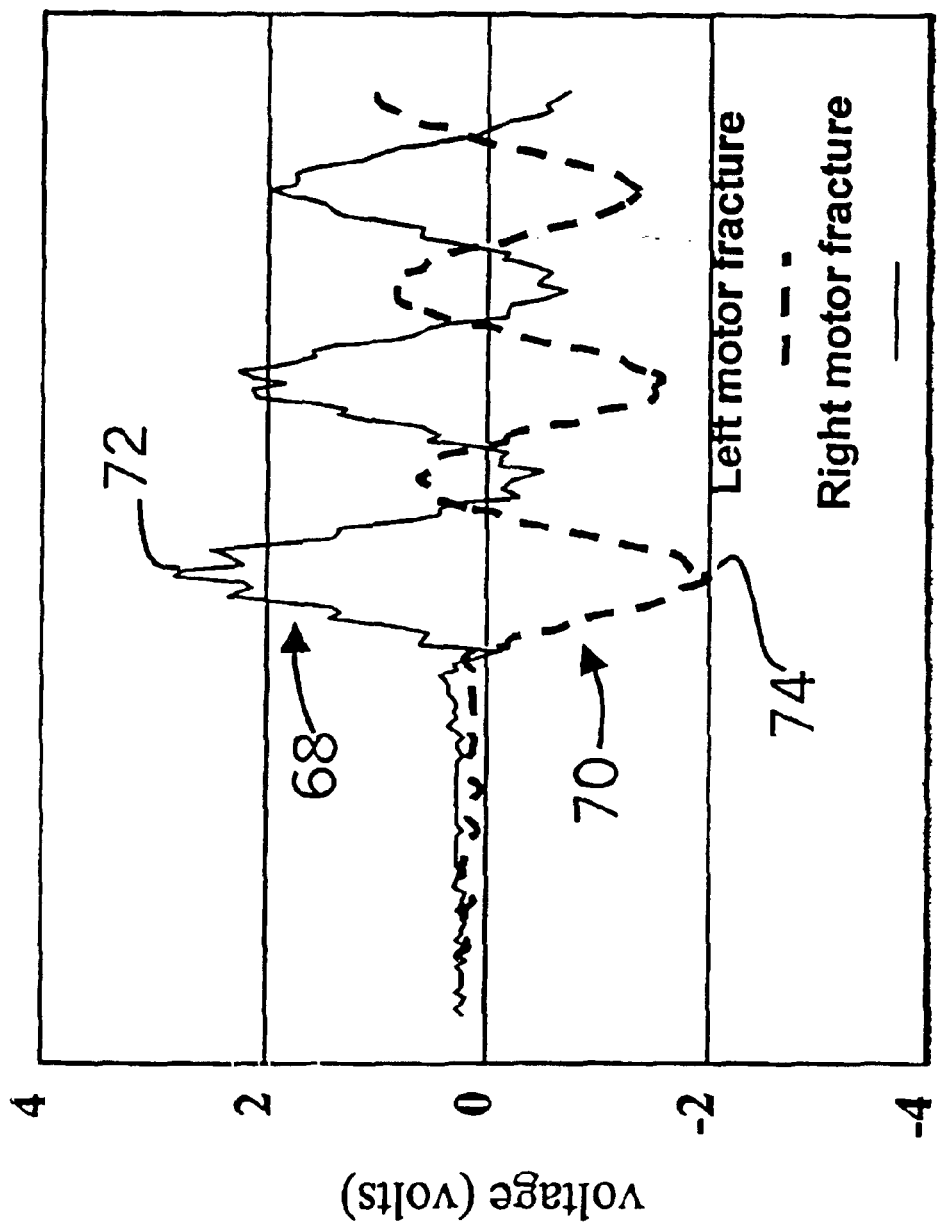
FIG. 4 shows the output waveforms for a suspension with a right and a left motor fracture.

FIG. 4 shows the output waveforms 68, 70 for a suspension with a right and left motor fracture. A right motor fracture produces a positive peak voltage 72 indicating the right motor is generating less voltage than normal. Adhesive delamination of the of the right motor will produce a similar output waveform and peak voltage. The output waveform 70 for a left motor fracture produces a negative peak voltage 74 indicating the left motor is generating less voltage than normal. Note that the peak voltages for both a left and right motor fracture are outside the range of voltages observed for parts with no defects, which is −0.8+/−0.2 v. Adhesive delamination of the left motor will produce a similar output waveform and peak voltage.

Figure 5:
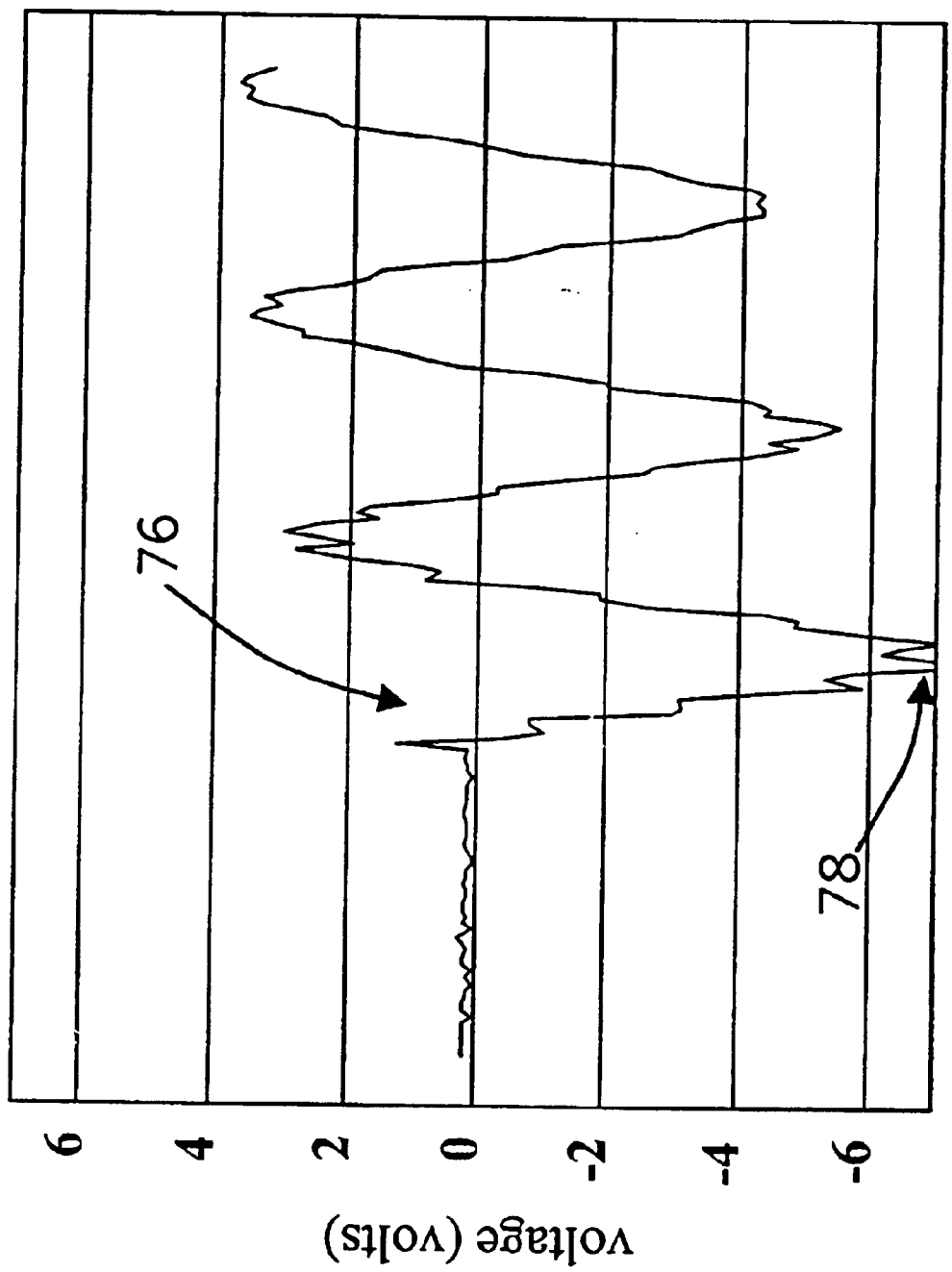
FIG. 5 shows the output waveform for a suspension that has a broken wire bond between the motors.

FIG. 5 shows an output waveform 76 of a suspension that has a broken wire bond between the motors. An electrical connection remains between the trace and the right motor; hence, a resultant peak voltage 78 is similar to the result 58 shown in FIG. 3c for the right motor.

Figure 6:
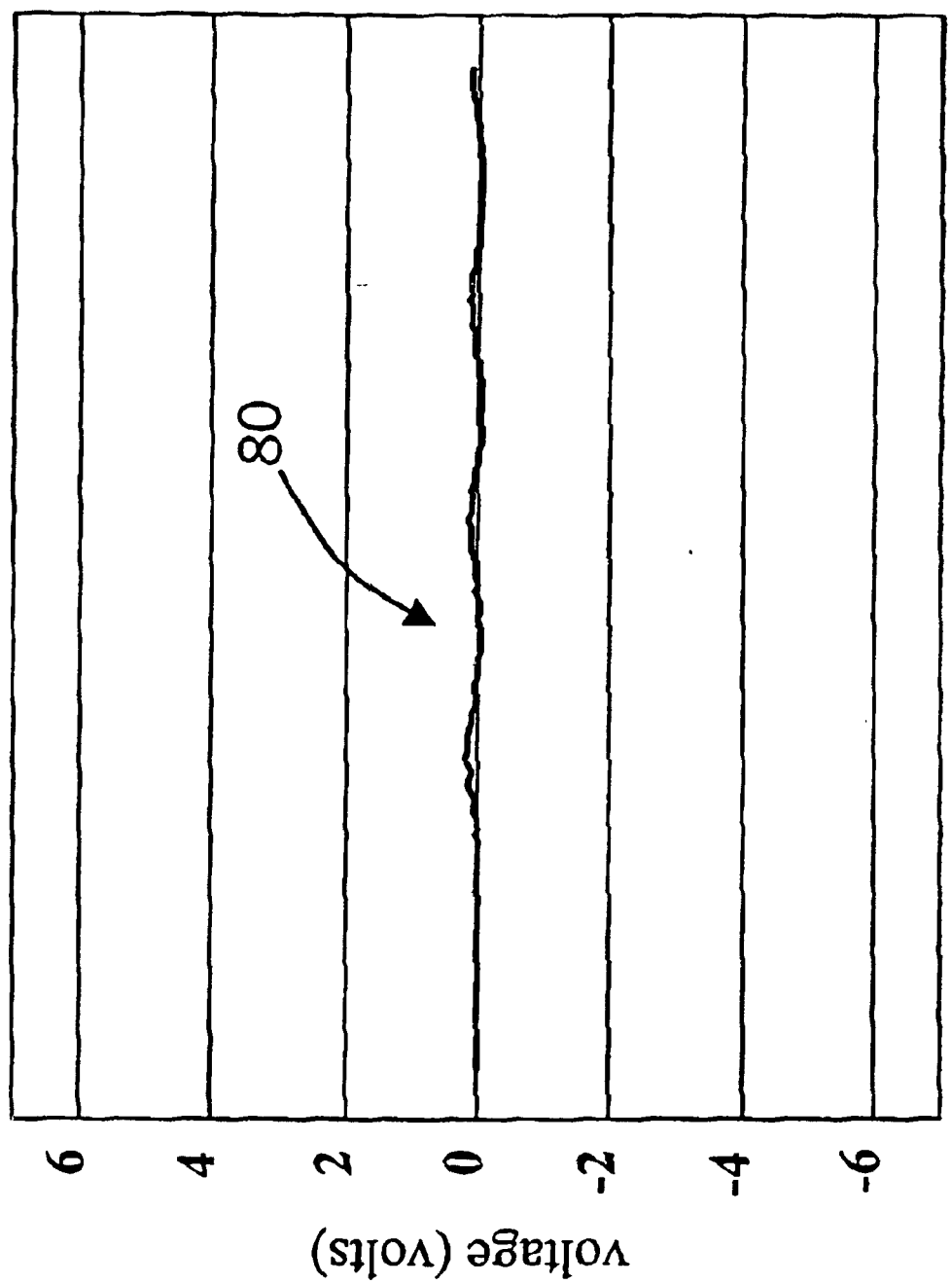
FIG. 6 shows the output waveform when both motors are depoled.

FIG. 6 shows an output waveform 80 when both motors are depoled. When PZT motors are depoled, they output a significantly lower voltage as the motors are flexed compared to PZT motors that are not depoled. Notice that the waveform 80 shows a significant reduction in peak voltage, which is easily detectable.

Figure 7:
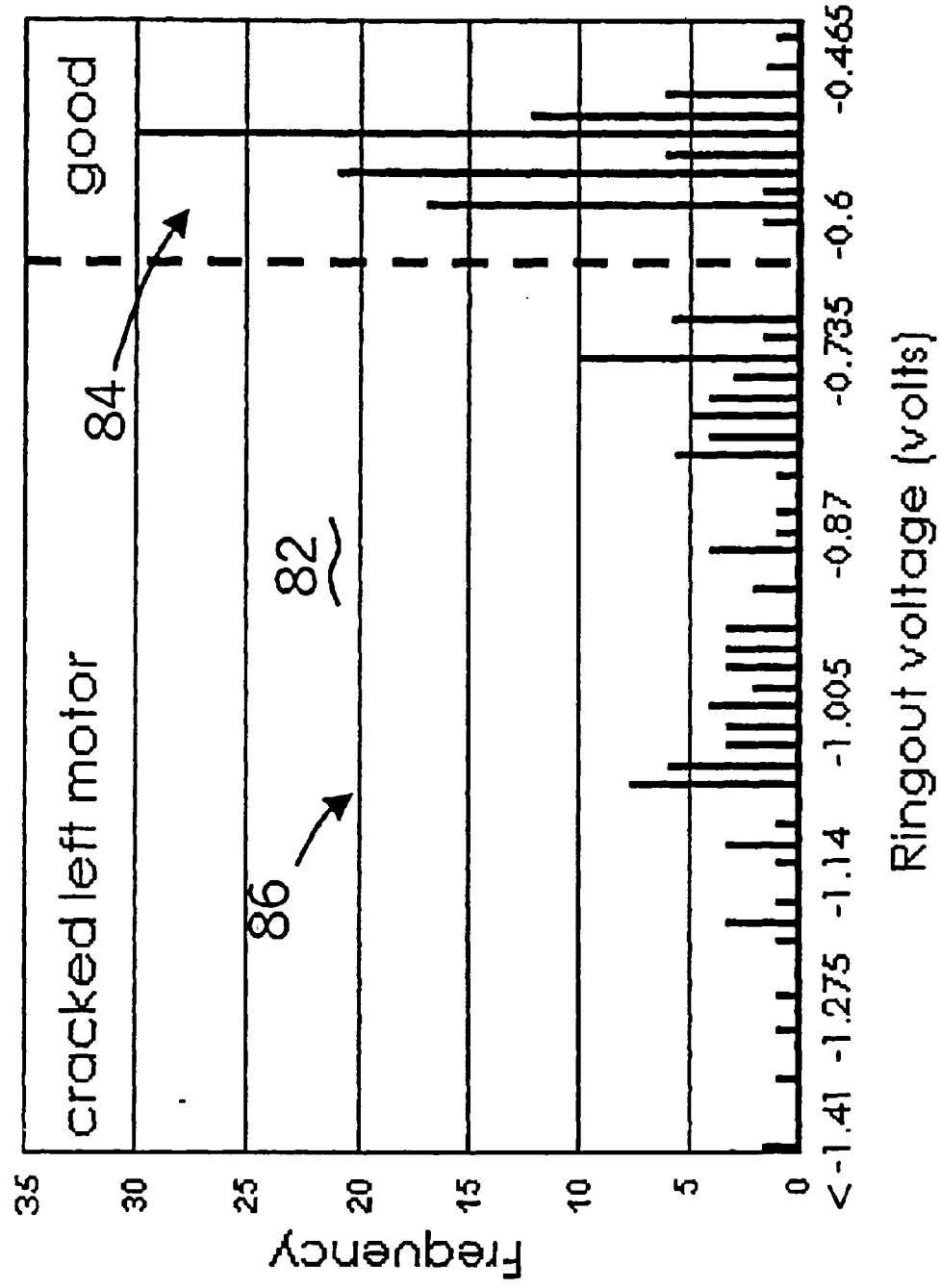
FIG. 7 is a histogram of good parts and parts with a cracked left motor.

FIG. 7 is a histogram 82 of good parts 84 and parts 86 with a cracked left motor which shows the separation/gap between the peak voltage of known good parts and the peak voltage of parts with a fractured left motor.

Figure 8A:
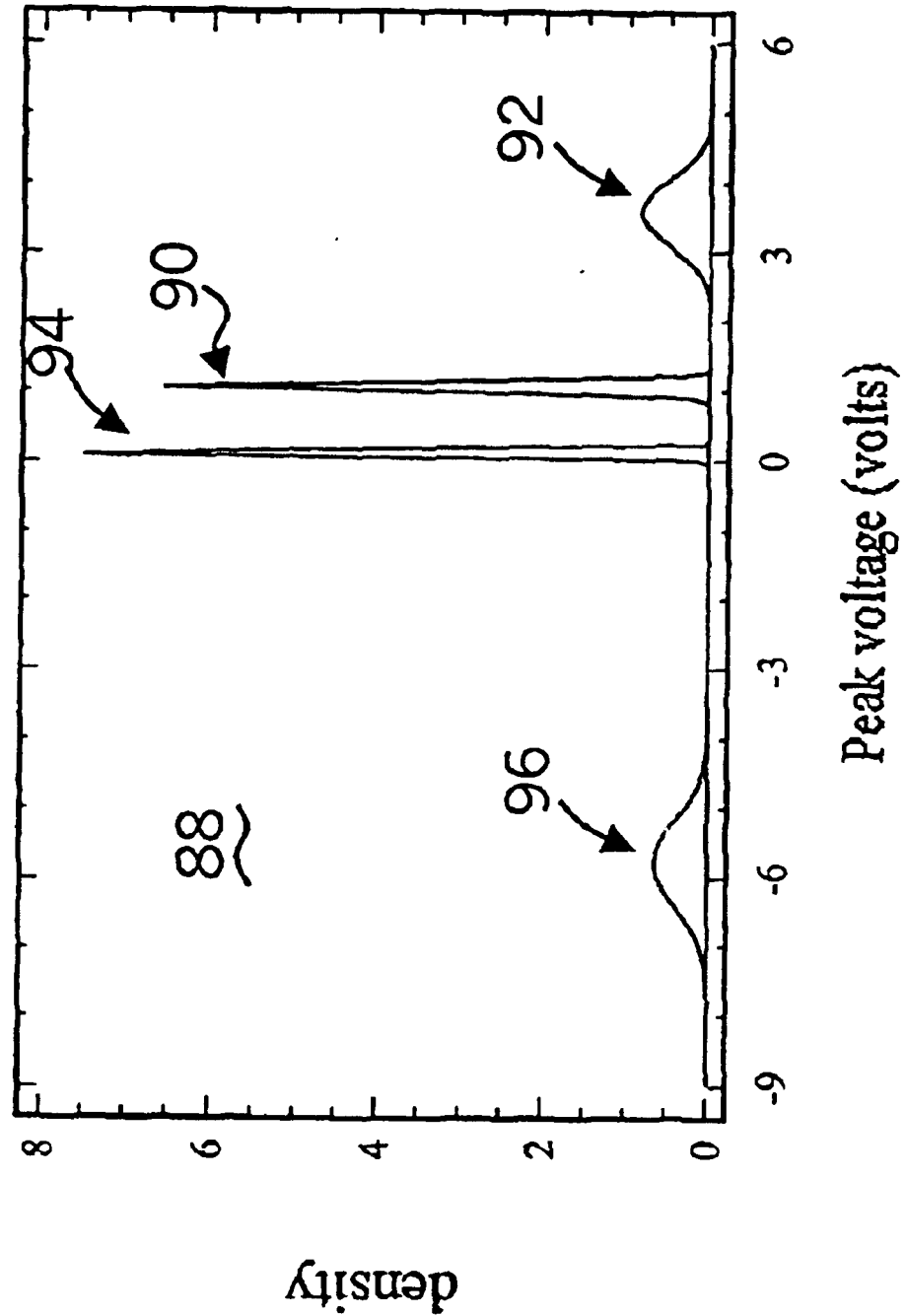
FIG. 8a is a graph in the form of a histogram of signal characteristics of microactuator suspension failure tests for properly functioning suspensions and for suspensions having different failure modes.

Testing has shown that the ringout method can reliably detect defects on this type of suspension. FIG. 8a is a graph of a histogram illustrating the number (density) of occurrences and signal characteristics of microactuated suspension failure tests in accordance with the invention for properly functioning ("good") suspensions (at 90) and suspensions having a number of different failure modes. The failure modes represented in FIG. 8a include motors having broken wire bonds (at 92), having depoled piezoelectric elements (at 94) and having elements that are poled the same (at 96). As shown, the peak signal distributions for the properly functioning and specific failure mode motors are relatively tight and distinguishable from one another. In particular, the peak signal level of good motors is at least about 1 volt (e.g., from "depoled" motors), and up to at least about 7 volts (from "poled same" motors), different in magnitude than the levels produced by the motors having the various failure modes. The mean and standard deviation for each of the distributions shown in FIG. 8a is listed in Table 1.

TABLE 1

| DISTRIBUTION | MEAN | STANDARD DEVIATION |
|---|---|---|
| 90 | 1.05425 | 0.0605694 |
| 92 | 3.57375 | 0.468772 |
| 94 | 0.10655 | 0.0367325 |
| 96 | −5.808 | 0.613837 |

Figure 8B:
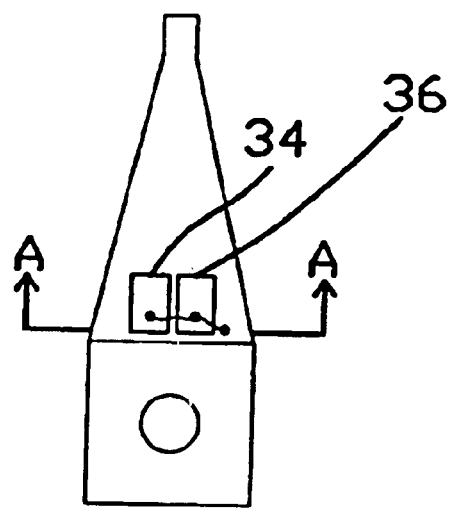
FIG. 8b is a key for FIGS. 8c–8e.
Figure 8C:
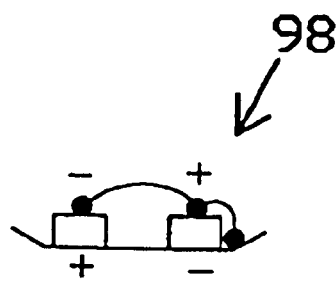
FIG. 8c shows a section view along line A—A of FIG. 8b with a wire 98 for a normal part.
Figure 8D:
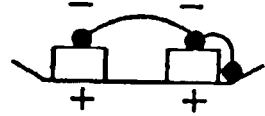
FIG. 8d shows a section view along line A—A of FIG. 8b for motors poled the same.
Figure 8E:
FIG. 8e shows a section view along line A—A of FIG. 8b for motors with a broken wire bond.

FIG. 8b is a key to FIGS. 8c–8e. FIG. 8c shows a section view along line A—A of FIG. 8b with a wire 98 for a normal part. FIG. 8d shows a section view along line A—A of FIG. 8b for motors poled the same, and FIG. 8e shows a section view along line A—A of FIG. 8b for motors with a broken wire bond.

Figure 9:
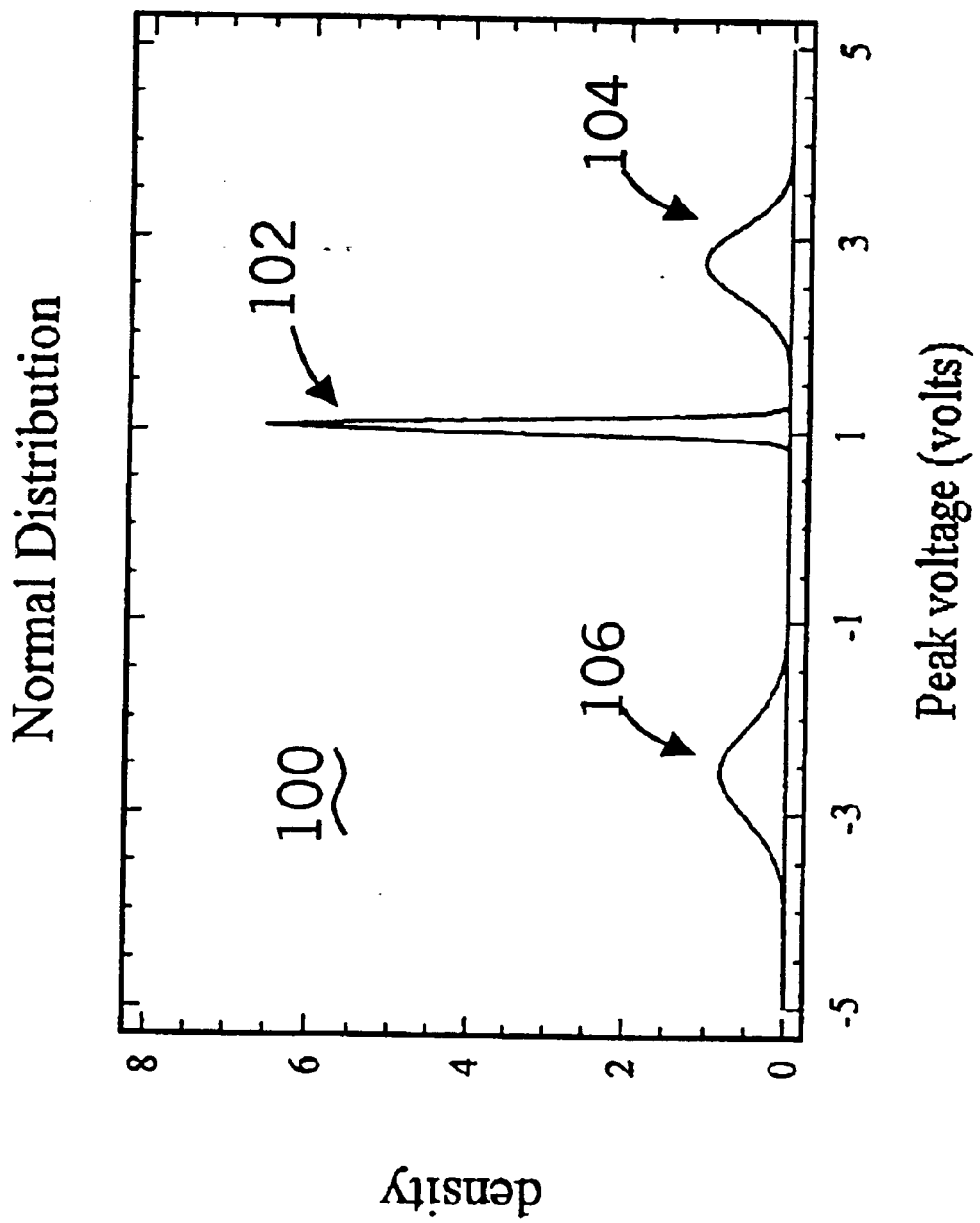
FIG. 9 is a graph in the form of a histogram of signal characteristics of microactuator suspension failure tests for properly functioning suspensions and for suspensions having fractures in one of the piezoelectric elements.

FIG. 9 is a graph of a histogram illustrating the number (density) of occurrences and signal characteristics of microactuated suspension failure tests in accordance with the invention for properly functioning ("good") suspensions and suspensions having motors with fractures in one of either the left or right piezoelectric elements. Distribution 102 is for good parts, distribution 104 is for parts with an adhesive fracture at the left motor, and distribution 106 is for parts with an adhesive fracture at the right motor. The mean and standard deviation for each of these distributions is shown in Table 2.

TABLE 2

| DISTRIBUTION | MEAN | STANDARD DEVIATION |
|---|---|---|
| 102 | 1.05425 | 0.0605694 |
| 104 | 2.762 | 0.365921 |
| 106 | −2.562 | 0.473926 |

Figure 10:
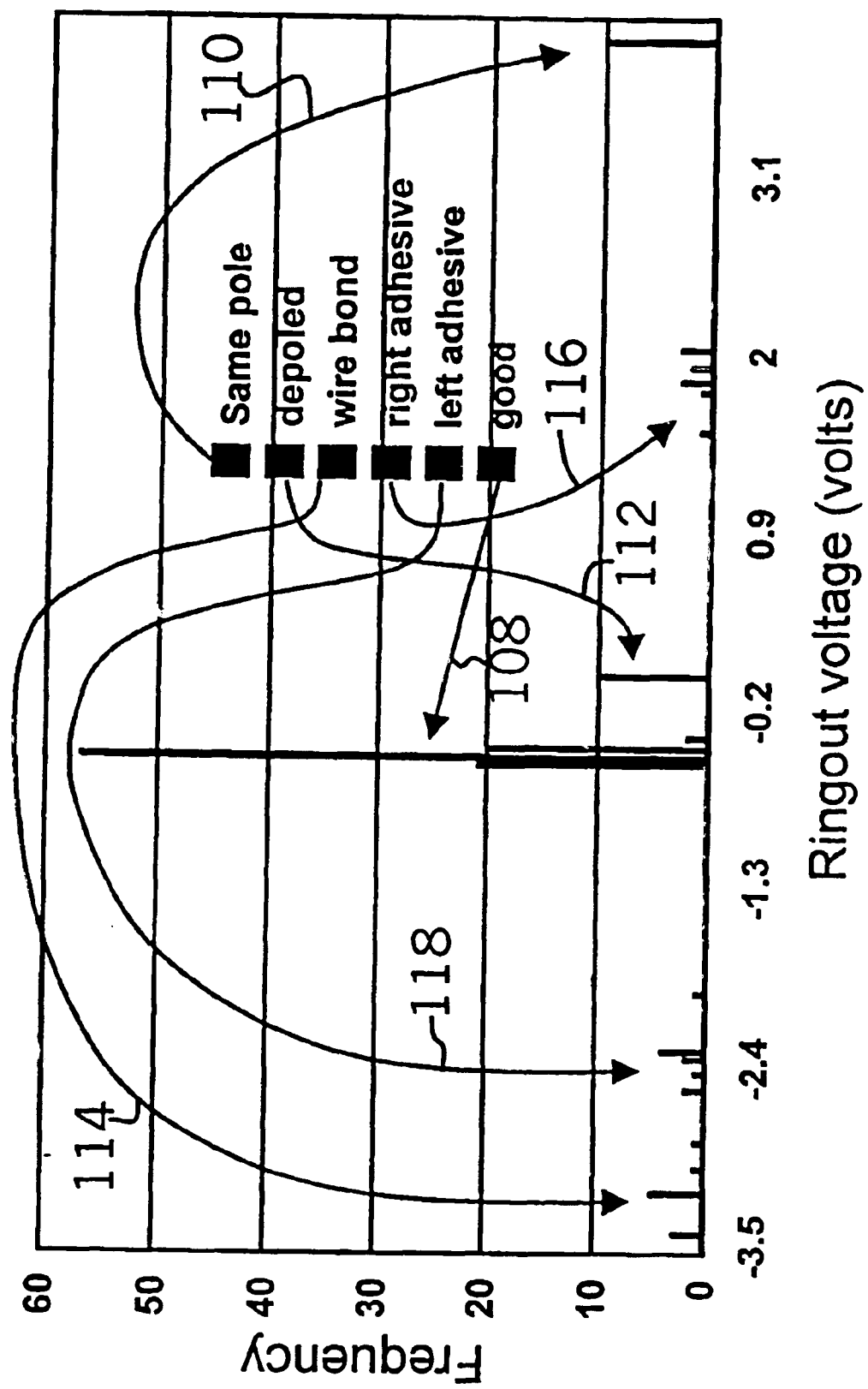
FIG. 10 is a histogram of good parts and parts with various other defects.

Referring now to FIG. 10, the separation between known good parts 108 and those with additional defects that the ringout method can detect may be seen. It is to be understood that the data for FIG. 10 has a sign change because the data for FIG. 10 was taken from a suspension intended for operation on the opposite side of a rotating magnetic disk. Furthermore, magnitude of the data for FIG. 10 differs from the data in FIGS. 8a and 9 because the data for FIG. 10 was taken from a different model of suspension than that tested for FIGS. 8a and 9. Nevertheless, it can be seen that discrete, identifiable defects include "same pole" 110, depoled parts 112, broken wire bonds 114, right motor adhesive failure 116 and left motor adhesive failure 118.

Figure 11:
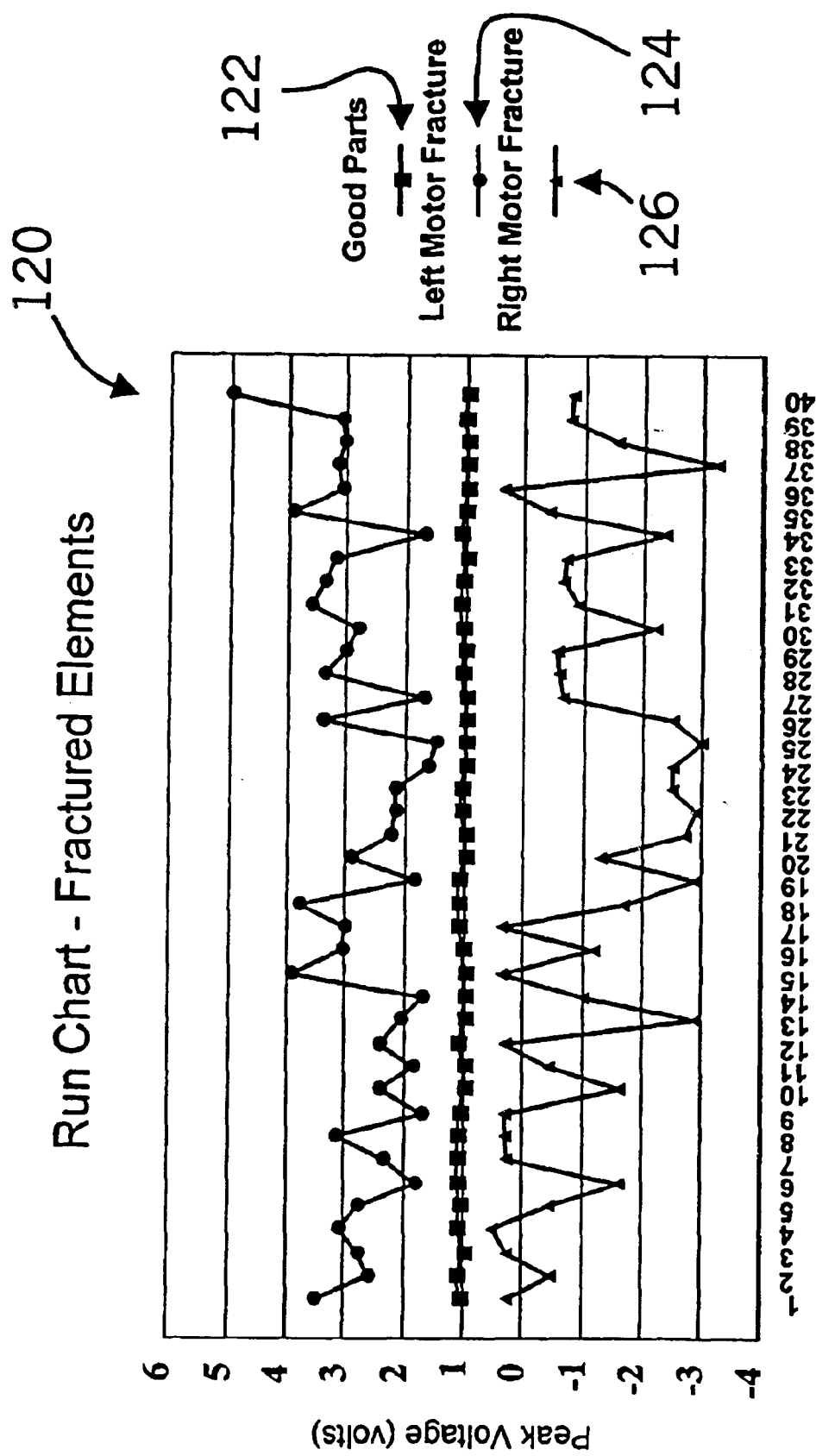
FIG. 11 is a graph of signal levels from a series of tested components, some of which are properly functioning, and some of which have fractures in either a left or a right piezoelectric element.

FIG. 11 is a graph 120 illustrating the signal levels from a series of tested components which are properly functioning ("good parts"), or have fractures in either the left or right piezoelectric element of the motor. Good parts are indicated by a square 122, left motor fracture parts by a diamond 124, and right motor fracture parts by a triangle 126.

Figure 12:
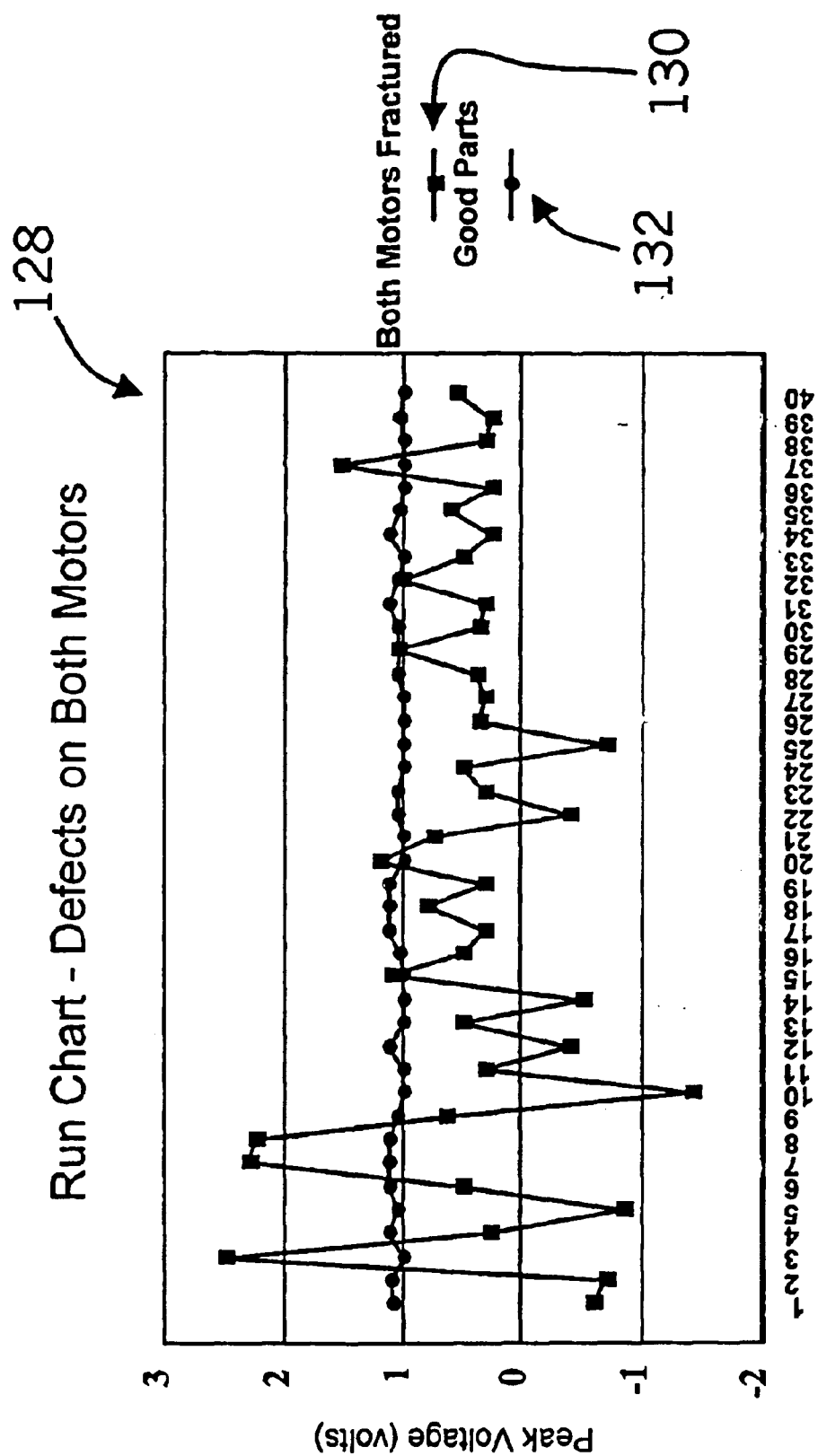
FIG. 12 is a graph of signal levels from a series of tested components, some of which are properly functioning, and some of which have fractures in both piezoelectric elements.

FIG. 12 is a graph 128 illustrating the signal levels from a series of tested components which are properly functioning ("good parts" indicated by a square 130), or have fractures in both piezoelectric elements of the motor (indicated by a diamond 132).

Figure 13:
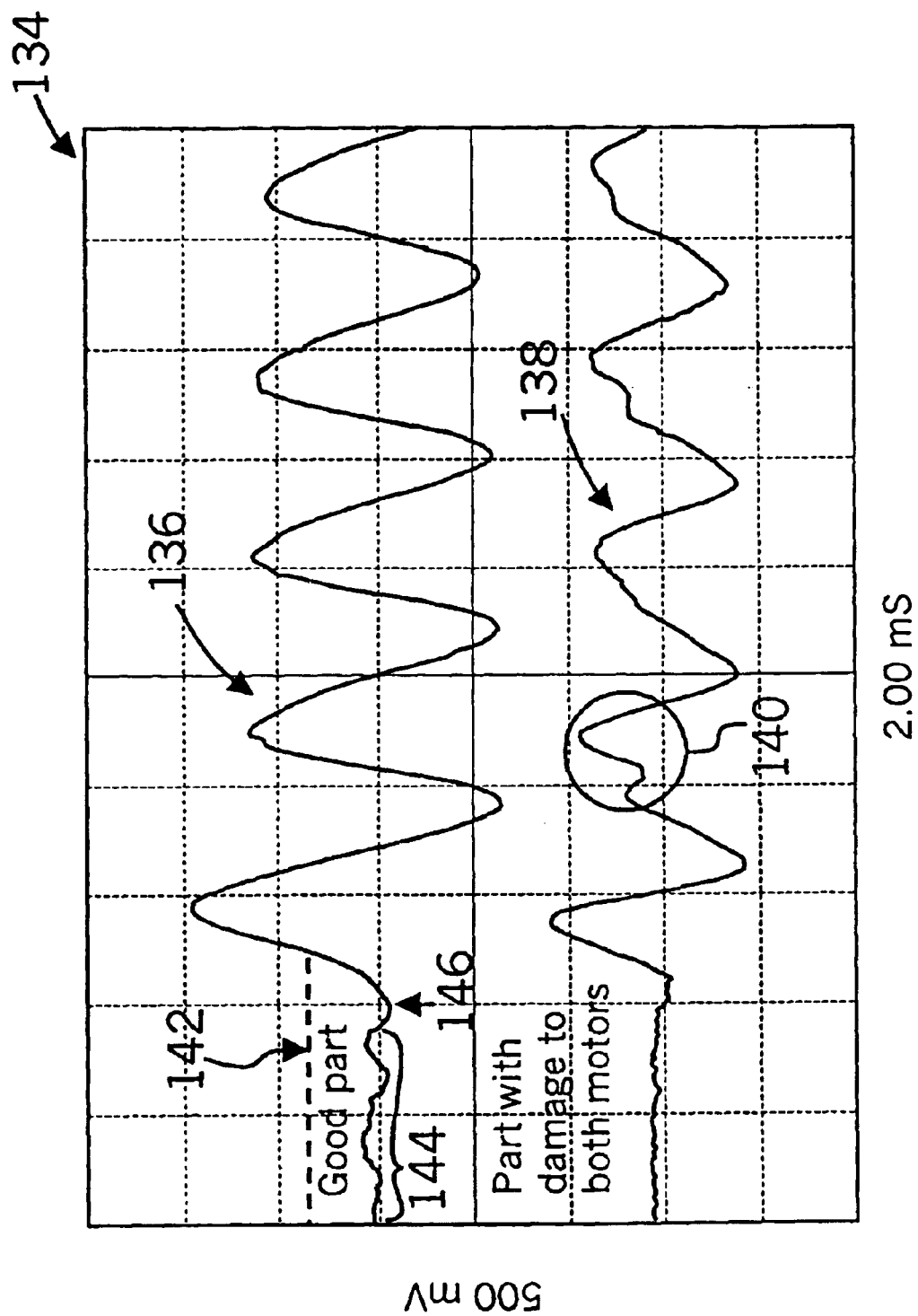
FIG. 13 is a graph of electrical signals produced by a properly functioning and mounted microactuator motor and a suspension motor having failure modes in both piezoelectric elements.

FIG. 13 is a graph 134 illustrating the signal levels from a properly functioning suspension motor (at 136) and a suspension motor having failure modes in both its piezoelectric elements (at 138). As shown, in addition to the signal levels, the shape characteristics of the signal from the damaged motor (i.e., asymmetric, not a sine wave) are also sufficiently different than the shape characteristics of the signal from the properly functioning motor to enable detection of the failure mode by a comparison of the signals (e.g., electronically or visually). As indicated by circle 140, the waveform 138 can show a bad part even if the peak voltage does not. It is to be noted that with respect to waveform 136 for a good part, the oscilloscope trigger was set at level 142. Waveform 136 displays noise 144 until the part is released at 146.

Microcracks

Turning to another type of failure, at this time, parts with micro cracks are not detectable using the ringout method alone. However, a method has been found to detect micro cracks by subjecting the motors to a high voltage electrical signal at a resonant frequency of the suspension (sway mode). The part must be rigidly held at the base plate with the suspension in an unloaded state. The vibration (actuation) created by this procedure causes the crack to propagate into a large fracture which is easily detectable. Investigation will determine effects of applying a high voltage sweep on PZT elements and the suspension assembly.

Tests have demonstrated that hairline and microcracks (i.e., very fine cracks) in the piezoelectric actuators can produce electrical signal characteristics which fall within the normal distribution of properly functioning motors. Cracks of these types typically extend through the gold layer, but are not visible under low magnification (e.g., 10×) unless the load beam is flexed. Microcracks located under the gold layer are generally not visible under any magnification, even if the load beam is flexed. However, very fine cracks of these types can be propagated into larger cracks which can be more accurately detected by the invention by applying a relatively large sweep frequency sine wave signal to the motor for a relatively short time period. The frequency range of the signal sweep preferably extends through at least one of the resonant frequencies of the suspension. As the suspension resonates, the very fine cracks will increase in size and propagate through the gold coating layer on the piezoelectric element. Arcing also occurs along the crack on the gold surface, thereby making the crack visible under low magnification. By way of example, tests of the invention have been performed by applying a 90 volt peak, 7 KHz–9 KHz sweep frequency sine wave of 750 msec duration. Although this signal is larger than the typical PZT motor operating voltage, it does not damage the PZT motor or the suspension (other than propagating existing cracks).

Figure 14:
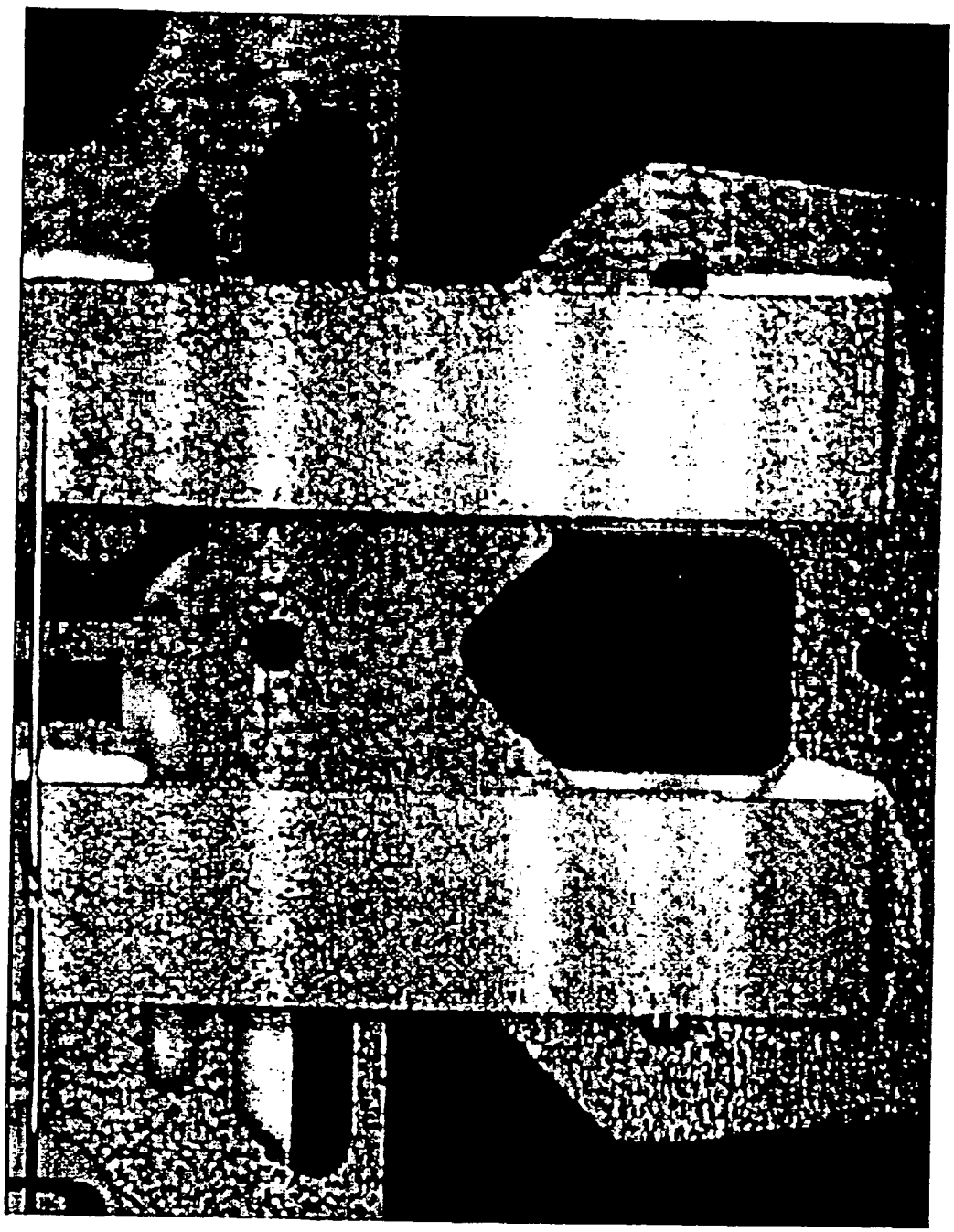
FIG. 14 is a photograph of the piezoelectric elements of a suspension microactuator motor having a microcrack (not visible) before application of a sweep frequency signal in accordance with a certain aspect of the present invention.
Figure 15:
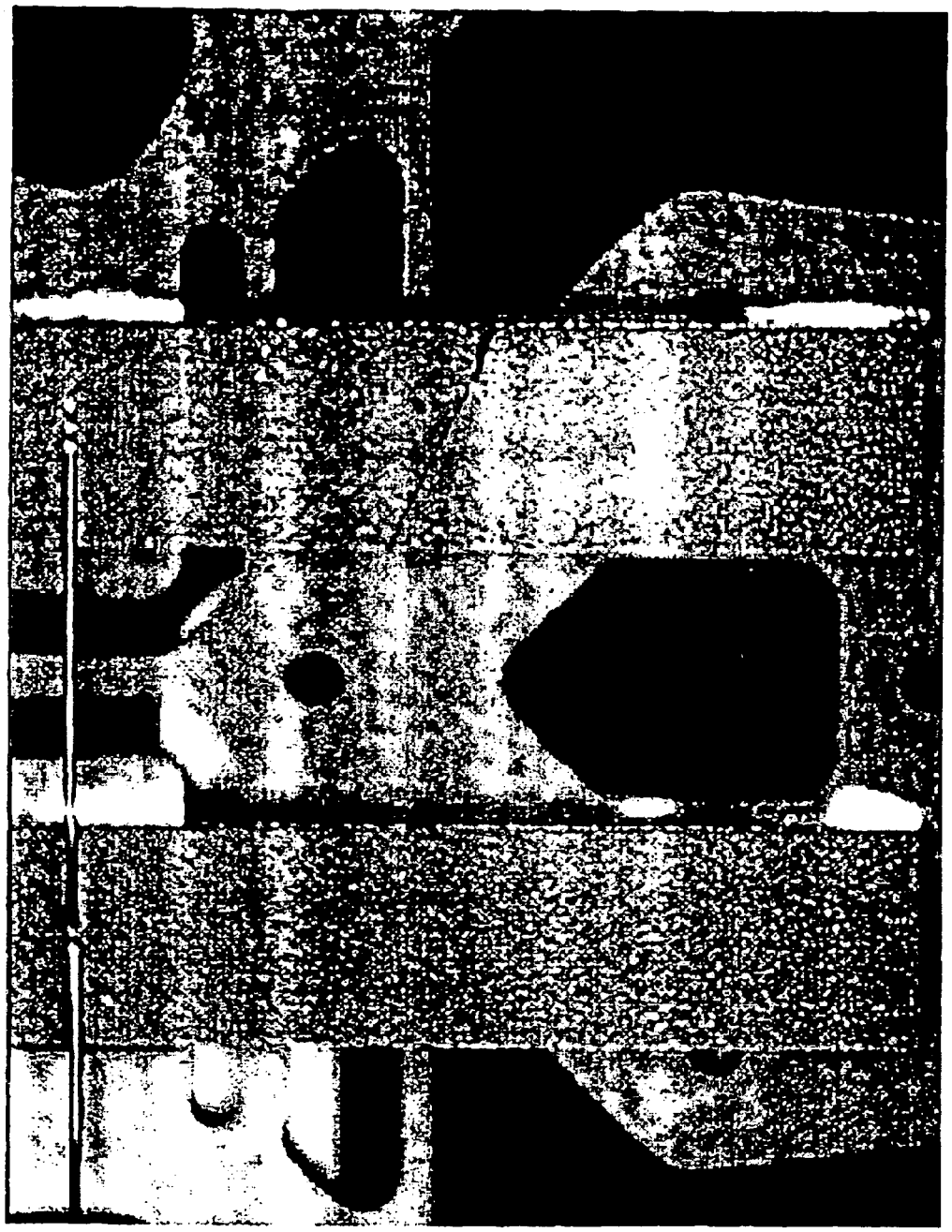
FIG. 15 is a photograph of the motor of FIG. 9 after application of a crack-expanding sweep frequency signal.

Following the application of this excitation signal, the suspension motor can be tested using the method described above. FIG. 14 is a photograph of the piezoelectric elements of a suspension microactuator motor having a microcrack (not visible) before application of a sweep frequency signal in accordance with the method described above. FIG. 15 is a photograph of the motor shown in FIG. 14 after application of the crack-expanding sweep frequency signal, with the microcrack now visible through the gold surface of the motor.

Summary

The ringout test method can detect many types of structural damage to the PZT motors, such as a broken wire bond, delaminated adhesive bond, depoled motors, and some types of fractured motors. While micro cracks are not detectable by this method alone, there is a method to use in conjunction with ringout that has the ability to detect micro cracks. Table 3 lists the defects and change in peak voltage from a known good part, illustrating the significance of the methods of the present invention.

TABLE 3

| Defect | Characteristics |
| --- | --- |
| Right motor - micro crack | No change |
| Left motor - micro crack | No change |
| Right motor - hairline fracture | 30% to 450% change |
| Left motor - hairline fracture | 60% to 250% change |
| Right motor - large fracture | 150% to 500% change |
| Left motor - large fracture | 60% to 400% change |
| Right motor - adhesive delamination | 350% to 600 % change |
| Left motor - adhesive | 200% to 400% change |
| Broken wire bond | 300% to 800% change |
| Both motors depoled | 80% to 130% change |

What is claimed is:

1. A method for detecting failure in a piezoelectric element on a head suspension for a disk drive comprising the steps of:

a. clamping one end of a head suspension under test, the head suspension having a piezoelectric element thereon;

b. mechanically displacing and rapidly releasing the other end of the head suspension under test;

c. monitoring an electrical output of the piezoelectric element on the head suspension under test; and d. comparing the electrical output of the piezoelectric element on the head suspension under test with a predetermined output corresponding to a properly functioning piezoelectric element mounted on the same type of head suspension to determine if the piezoelectric element on the head suspension under test is properly functioning.

2. The method of claim 1 wherein step d) comprises comparing the electrical output of the piezoelectric element on the head suspension under test with a predetermined voltage level.

3. Apparatus for detecting failure in a piezoelectric element on a head suspension for a disk drive comprising:

a. a clamp connected to one end of a head suspension under test, the head suspension having a piezoelectric element thereon;

b. a motion actuator in mechanical contact with the other end of the head suspension under test and operative to mechanically displace and rapidly release the other end of the head suspension under test;

c. a signal processor system electrically connected to an output of the piezoelectric element on the head suspension under test and operative to compare the output of the piezoelectric element on the head suspension under test with a predetermined output corresponding to a properly functioning piezoelectric element mounted on the same type of head suspension to determine if the piezoelectric element on the head suspension under test is properly functioning.

4. The apparatus of claim 3 wherein the head suspension under test oscillates at a natural frequency after step b) is performed, and the output of the piezoelectric element on the head suspension under test is a waveform having a fundamental periodic frequency with at least one of a group of distinguishing amplitude characteristics corresponding to individual failure modes from the group of adhesive fracture between the element and the suspension, fracture of the piezoelectric element itself, poling failure of the piezoelectric element, and a broken electrical connection in a wire bond to the piezoelectric element.

* * * * *